United States Patent
Gider et al.

(10) Patent No.: US 10,816,612 B2
(45) Date of Patent: Oct. 27, 2020

(54) CROSS-AXIS SHIELD FOR OUT-OF-PLANE MAGNETOMETER

(71) Applicant: Apple Inc., Cupertino, CA (US)

(72) Inventors: Savas Gider, San Jose, CA (US); Jian Guo, Milpitas, CA (US); Chaitanya Mudivarthi, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 313 days.

(21) Appl. No.: 15/993,528

(22) Filed: May 30, 2018

(65) Prior Publication Data

US 2019/0369169 A1    Dec. 5, 2019

(51) Int. Cl.
*G01R 33/00* (2006.01)
*G01C 17/02* (2006.01)
*G01R 33/09* (2006.01)

(52) U.S. Cl.
CPC ......... *G01R 33/0082* (2013.01); *G01C 17/02* (2013.01); *G01R 33/091* (2013.01)

(58) Field of Classification Search
CPC ........ G01C 17/02; G01C 21/08; G01C 25/00; G01R 33/0017; G01R 33/0029; G01R 35/005; G01R 33/0011; G01R 33/0094; G01R 33/07; G01R 33/091; G01R 33/093
USPC .......................................................... 33/357
See application file for complete search history.

(56) References Cited

U.S. PATENT DOCUMENTS

| | | | |
|---|---|---|---|
| 5,351,555 A | 10/1994 | Garshelis | |
| 6,256,863 B1 | 7/2001 | Saito et al. | |
| 6,853,185 B2 | 2/2005 | Tsukamoto et al. | |
| 9,274,180 B2 | 3/2016 | Zeyen | |
| 2008/0202199 A1* | 8/2008 | Finley | G01C 25/005 73/1.77 |
| 2011/0246117 A1* | 10/2011 | Moore | G01K 7/42 702/99 |
| 2013/0124127 A1* | 5/2013 | Ahuja | G06F 1/3206 702/86 |
| 2013/0197845 A1* | 8/2013 | Keal | G01P 21/00 702/96 |
| 2017/0090003 A1 | 3/2017 | Guo | |
| 2018/0017635 A1 | 1/2018 | Guo | |
| 2019/0277655 A1* | 9/2019 | Masad | G01C 25/00 |
| 2019/0369169 A1* | 12/2019 | Gider | G01R 33/0082 |

FOREIGN PATENT DOCUMENTS

JP    3944492    7/2007

\* cited by examiner

*Primary Examiner* — Yaritza Guadalupe-McCall
(74) *Attorney, Agent, or Firm* — Fish & Richardson P.C.

(57) ABSTRACT

Disclosed is a magnetometer architecture that uses a separate shield to minimize cross-axis sensitivity with low impact on main axis sensitivity. In an embodiment, a magnetometer with cross-axis shielding comprises: a ring shield; a magnetic yoke disposed within the ring shield; and one or more magnetic field sensors disposed between the ring shield and the magnetic yoke, the magnetic field sensors positioned relative to the ring shield and the magnetic yoke such that flux induced by a magnetic field is absorbed in a cross-axis direction of the magnetometer.

20 Claims, 3 Drawing Sheets

CROSS-AXIS SHIELD FOR OUT-OF-PLANE MAGNETOMETER

TECHNICAL FIELD

This disclosure relates generally to magnetometers.

BACKGROUND

A magnetometer is a sensor that measures the direction, strength or relative change of a magnetic field (e.g., the earth's magnetic field) at a particular location. A digital compass found on many modern mobile devices uses a magnetometer to derive heading information to be used by a compass or navigation application.

SUMMARY

Disclosed is a magnetometer architecture that uses a separate shield to minimize cross-axis sensitivity with low impact on main axis sensitivity.

In an embodiment, a magnetometer with cross-axis shielding comprises: a ring shield; a magnetic yoke disposed within the ring shield; and one or more magnetic field sensors disposed between the ring shield and the magnetic yoke, the sensors positioned relative to the ring shield and the magnetic yoke such that flux induced by a magnetic field is absorbed in a cross-axis direction of the magnetometer.

In an embodiment, an electronic device comprises: a magnetometer comprising: a ring shield; a magnetic yoke disposed within the ring shield; and one or more magnetic field sensors disposed between the ring shield and the magnetic yoke, the magnetic field sensors positioned relative to the ring shield and the magnetic yoke such that flux induced by a magnetic field is absorbed in a cross-axis direction of the magnetometer; one or more processors; memory storing instructions that when executed by the one or more processors, cause the one or more processors to perform operations comprising: obtaining, by the one or more processors from the magnetometer, magnetometer output data; and calculating, by the one or more processors, a directional heading of the electronic device using the magnetometer output data.

In an embodiment, an integrated circuit device comprises: a ring shield; a magnetic yoke disposed within the ring shield; and one or more magnetic field sensors disposed between the ring shield and the magnetic yoke, the magnetic field sensors positioned relative to the ring shield and the magnetic yoke such that flux induced by a magnetic field is absorbed in a cross-axis direction of the magnetometer.

Particular embodiments disclosed herein provided one or more of the following advantages. The disclosed embodiments optimize the performance of a magnetometer for magnetic fields that are perpendicular to the plane of a substrate of the magnetometer (e.g., out-of-plane fields). The embodiments also improve the rejection of in-plane (cross-axis) fields with minimal impact on out-of-plane (main axis) fields. These optimizations improve the accuracy of the magnetometer, which in turn, improves the accuracy of magnetometer readings used by various applications, such as compass applications, where the magnetometer is used to provide a compass heading for a mobile device.

The details of the disclosed implementations are set forth in the drawings and the description below. Other features, objects and advantages are apparent from the description, drawings and claims.

DESCRIPTION OF DRAWINGS

The same reference symbol used in various drawings indicates like elements.

DETAILED DESCRIPTION

Example Magnetometer Operation

Figure 1:
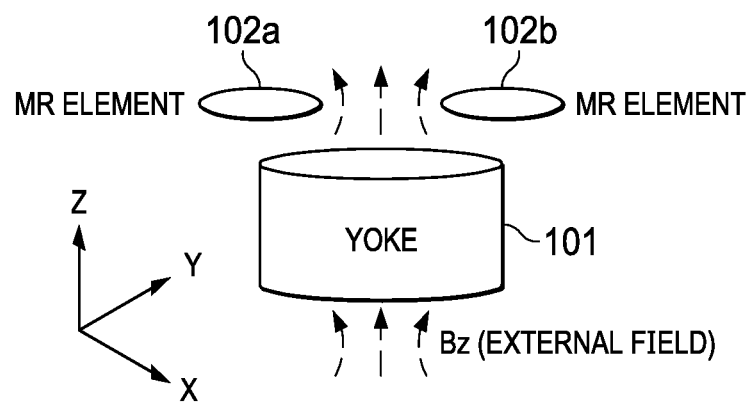
FIG. 1 illustrates a magnetic yoke of an out-of-plane sensor that redirects flux to in-plane magnetic field sensors, according to an embodiment.

FIG. 1 illustrates a magnetic yoke of an out-of-plane sensor that redirects flux to in-plane magnetic field sensors, according to an embodiment. Magnetic yoke 101 is shown redirecting magnetic flux to in-plane magnetic field sensors 102a, 102b. In an embodiment, the operation of magnetic field sensors 102a, 102b is based on the Anisotropic magnetoresistive (AMR) effect. However, the embodiments disclose here are applicable to any thin film sensor that responds to magnetic fields in the plane of the film. The AMR effect is the change of resistivity of a current carrying ferromagnetic material due to a magnetic field. The resistance depends on the angle formed by the internal magnetization vector of the ferromagnetic material and the direction of the current flow. Resistance is largest if the current flow and the internal magnetization vector are parallel. The resistance in ferromagnetic material is smallest if the angle is 90° between the current flow and the internal magnetization vector.

Most magnetic field sensors are sensitive only to fields in the plane of the thin film. This includes Anisotropic MR (AMR), Giant MR (GMR) and Tunnel MR (TMR) sensors. It is desired that a magnetometer respond to out-of-plane fields (main axis Z sensitivity) and not to in-plane fields (cross-axis XY sensitivity). One solution is to connect different magnetic field sensors with opposite responses in a Wheatstone bridge to cancel any in-plane fields. This is difficult to accomplish for both (XY) in-plane fields. Another solution uses magnetic yoke 101 as a shield for the cross-axis direction and to redirect the flux to in-plane magnetic field sensors 102a, 102b, as shown in FIG. 1. The challenge of the second solution is to optimize the yoke/shield for both the main axis and cross axis.

Figure 2:
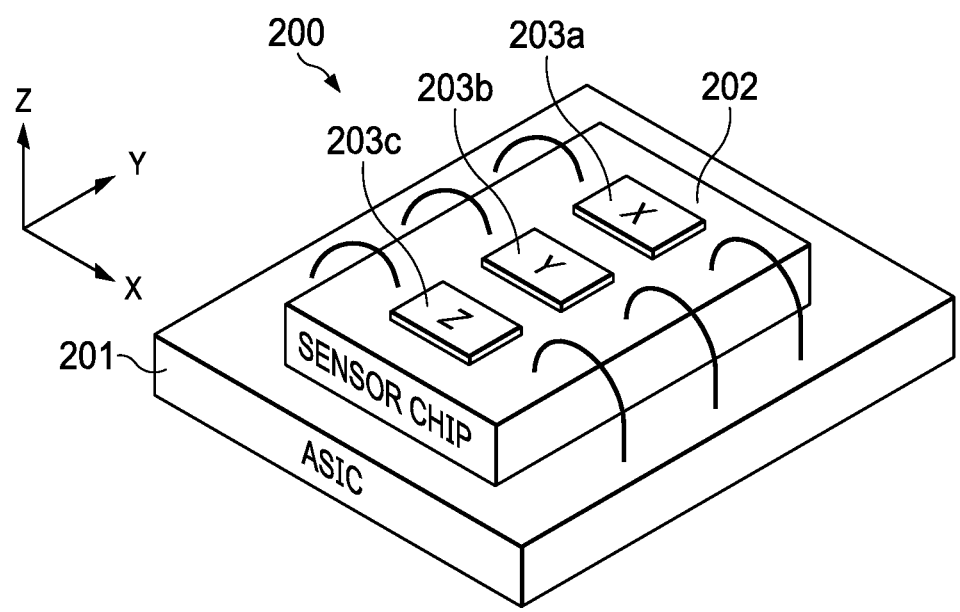
FIG. 2 illustrates an integrated circuit package with a 3-axis magnetic field sensor, according to an embodiment.

FIG. 2 illustrates an integrated circuit package with a 3-axis magnetic field sensor chip, according to an embodiment. In this example embodiment, package 200 includes application specific integrated circuit (ASIC) 201 and 3-axis magnetic field sensor chip 202 mounted on, and wire bonded to, ASIC 201. Magnetic field sensor chip 202 includes magnetic field sensors 203a-203c, one for each magnetic field axis (X, Y, Z). Magnetic field sensor 203c measures the out-of-plane magnetic field component (Z) and Magnetic field sensors 203a, 203b measure the in-plane magnetic field components (XY). In another embodiment, there may be separate chips for each magnetic field sensor.

In an embodiment, magnetic field sensors 203a-203c can be coupled in a Wheatstone bridge configuration with each sensor arranged to maximize sensitivity and minimize temperature influences. In the presence of an external magnetic field $B_z$, the resistance values of sensors 203a-203c change, causing a bridge imbalance and generating an output voltage proportional to the magnetic field strength.

Example Cross Axis Shield Configurations

Figure 3A:
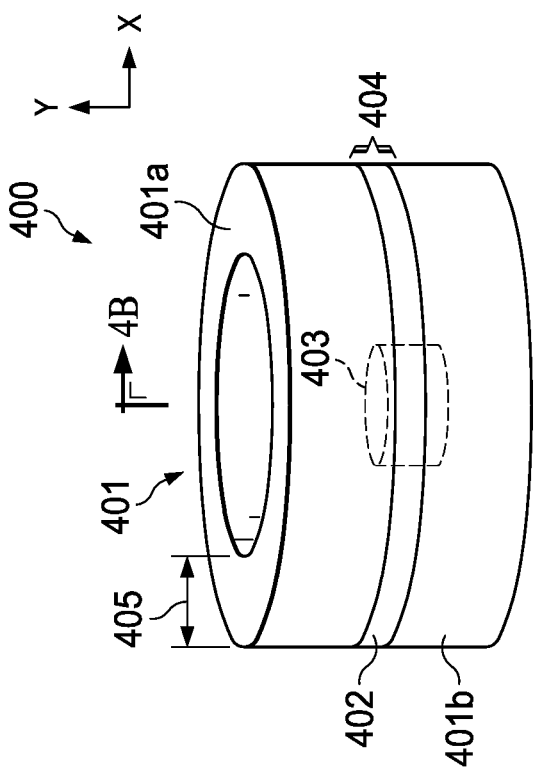
FIG. 3A is a plan view of a ring shield and separate yoke configuration, according to an embodiment.
Figure 3B:
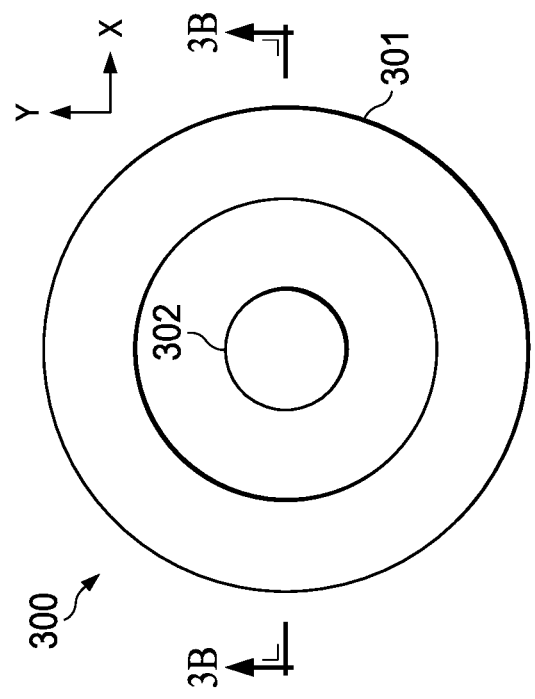
FIG. 3B is a cross-section view of a ring shield and separate yoke configuration, according to an embodiment.

FIGS. 3A and 3B are plan and cross-section views of a ring shield and separate yoke configuration 300, according to an embodiment. Configuration 300 includes ring shield 301 and magnetic yoke 302 disposed within ring shield 301. Ring shield 301 provides a cross-axis shield that surrounds the magnetic field sensors (not shown) and yoke 302. Ring shield 301 absorbs flux in the cross-axis (XY) directions and has a minimal effect on the flux in the main axis (Z) direction. In an embodiment, ring shield 301 includes a soft magnetic material with high permeability, such as Permalloy (e.g., Ni80Fe20). The magnetic field sensors and yoke 302 can be positioned vertically at a midpoint of a height of the ring shield 301 to maximize the cross-axis shielding effect. In another embodiment, multiple concentric rings can be used to reduce the cross-axis sensitivity further if necessary. A key advantage of configuration 300 is that yoke 302 and ring shield 301 can be optimized independently.

Figure 4A:
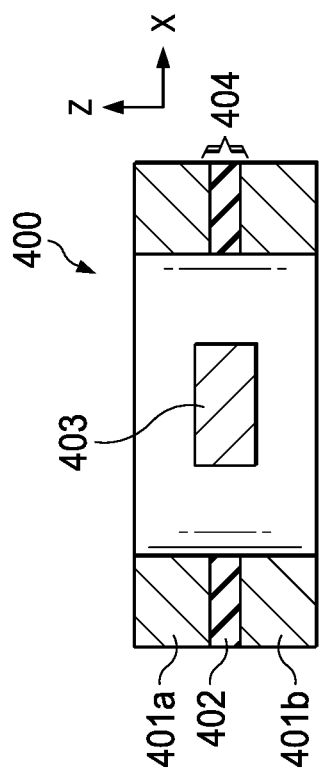
FIG. 4A is a side view of an alternative ring shield configuration, according to an embodiment.
Figure 4B:
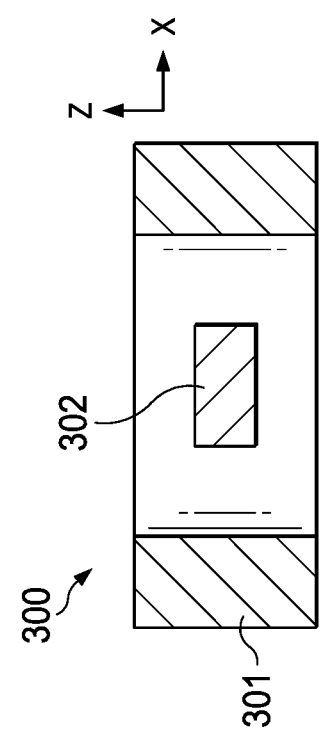
FIG. 4B is a cross-section view of an alternative ring shield configuration, according to an embodiment.

FIGS. 4A and 4B are side and cross-section views of an alternative ring shield configuration 400, according to an embodiment. Configuration 400 includes ring shield 401 including ring shield portions 401a, 401b, non-magnetic spacer 402 and yoke 403. As in configuration 300, ring shield 400 surrounds the magnetic field sensors (not shown) and yoke 403. In this alternative embodiment, ring shield portions 401a, 401b are made of magnetic material with non-magnetic spacer 402 disposed between ring shield portions 401a, 401b. Non-magnetic spacer 402 includes one or more non-magnetic laminations that reduce the effective permeability in the out-of-plane direction and redirect the out-of-plane field towards the magnetic field sensors (not shown) and yoke 403. The one or more non-magnetic laminations are made thin (e.g., form 0.01 micron to 1 micron) for ring shield 400 to absorb the in-plane magnetic field components. The lamination thickness should not be more than the radial width of the ring to prevent magnetic flux from leaking through the lamination gap. The in-plane magnetic field component decays exponentially in the non-magnetic spacer 402 with a characteristic length proportional to gap 404. Gap 404 is thinner than radial width 405 of ring shield 401.

Example Electronic Device Architecture

Figure 5:
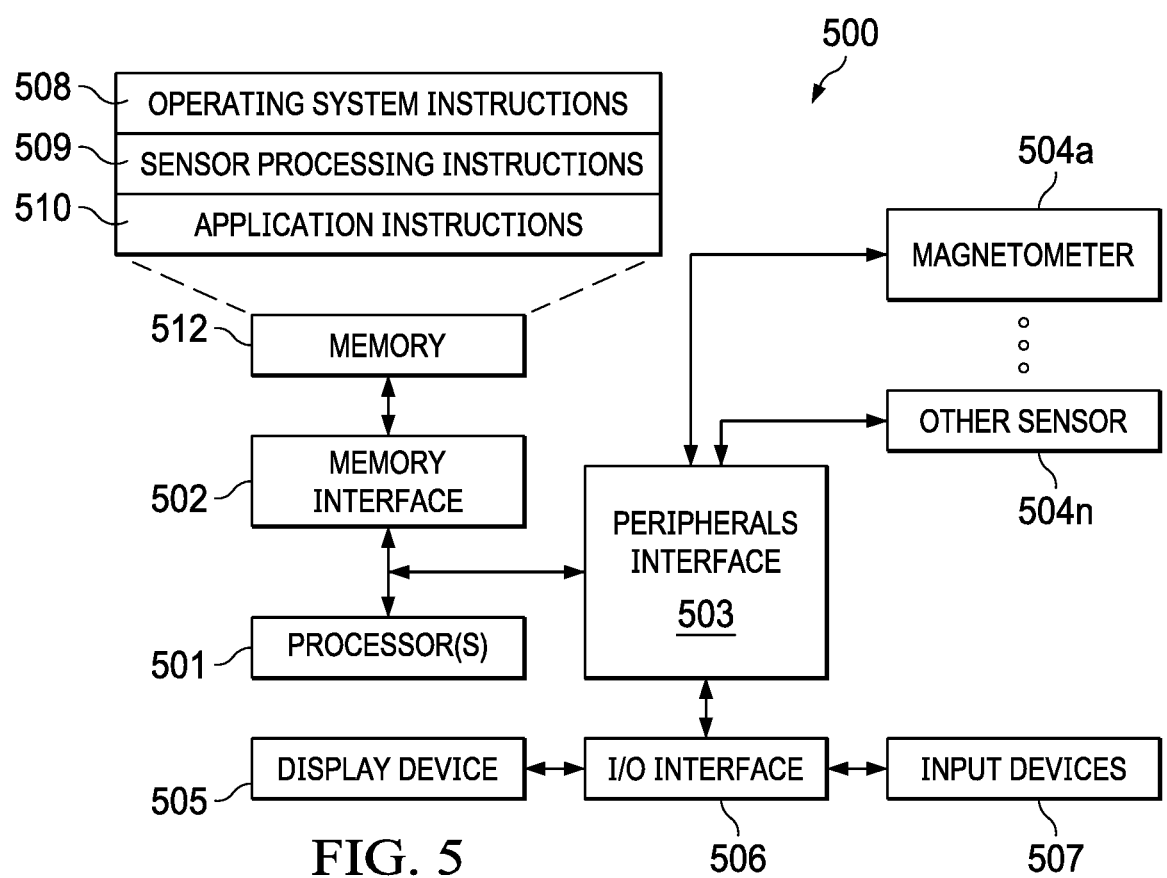
FIG. 5 is a block diagram of an electronic device architecture that includes at least one magnetometer that uses the technology described in reference to FIGS. 1-4.

FIG. 5 is a block diagram of an electronic device architecture 500 that includes at least one magnetometer that uses the technology described in reference to FIGS. 1-4. Architecture 500 includes processor(s) 501, memory interface 502, peripherals interface 503, sensors 504a . . . 504n, display device 505 (e.g., touch screen, LCD display, LED display), I/O interface 506 and input devices 507 (e.g., touch surface/screen, hardware buttons/switches/wheels, virtual or hardware keyboard, mouse). Memory 512 can include high-speed random access memory and/or non-volatile memory, such as one or more magnetic disk storage devices, one or more optical storage devices and/or flash memory (e.g., NAND, NOR).

Memory 512 stores operating system instructions 508, sensor processing instructions 509 and application instructions 510. Operating system instructions 508 include instructions for implementing an operating system on the device, such as iOS, Darwin, RTXC, LINUX, UNIX, WINDOWS, or an embedded operating system such as VxWorks. Operating system instructions 508 may include instructions for handling basic system services and for performing hardware dependent tasks. Sensor-processing instructions 509 perform post-processing on sensor data (e.g., averaging, scaling, formatting, calibrating) and provide control signals to sensors. Application instructions 510 implement software programs that use data from one or more sensors 504a . . . 504n, such as navigation, digital pedometer, tracking or map applications. At least one sensor 504a is a 3-axis magnetometer as described in reference to FIGS. 1-4.

For example, in a digital compass application executed on a smartphone, the magnetometer output data is provided to processor(s) 501 through peripheral interface 503. Processor(s) 501 execute sensor-processing instructions 509, to perform further processing (e.g., averaging, formatting, scaling) of the magnetometer output data. Processor(s) 501 execute instructions for various applications running on the smartphone. For example, a digital compass uses the magnetometer data to derive heading information to be used by a compass or navigation application. The more accurate the magnetometer data the more accurate the heading calculation for the electronic device. Other applications are also possible (e.g., navigation applications, gaming applications, calibrating other sensors).

While this document contains many specific implementation details, these details should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination. Logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A magnetometer with cross-axis shielding, comprising:
   a ring shield;
   a magnetic yoke disposed within the ring shield; and
   one or more magnetic field sensors disposed between the ring shield and the magnetic yoke, the magnetic field sensors positioned relative to the ring shield and the magnetic yoke such that flux induced by a magnetic field is absorbed in a cross-axis direction of the magnetometer.

2. The magnetometer of claim 1, wherein the magnetic field sensors and magnetic yoke are positioned vertically at a midpoint of a height of the ring shield.

3. The magnetometer of claim 1, wherein the ring shield comprises soft magnetic material with permeability above a specified threshold.

4. The magnetometer of claim 3, wherein the ring shield comprises Permalloy.

5. The magnetometer of claim 1, wherein the ring shield further comprises two or more concentric rings of magnetic material.

6. The magnetometer of claim 1, wherein the magnetic field sensors are included in a single integrated circuit chip.

7. The magnetometer of claim 1, wherein the magnetic field sensors are coupled in a Wheatstone bridge configuration with each sensor arranged to maximize sensitivity and minimize temperature influences.

8. The magnetometer of claim 1, wherein the ring shield further comprises a first ring shield portion of magnetic material, a second ring shield portion of magnetic material and a non-magnetic spacer disposed between ends of the first and second ring field portions of magnetic material, forming a cavity for receiving the magnetic yoke and magnetic field sensors.

9. The magnetometer of claim 8, wherein the non-magnetic spacer includes one or more laminations of non-magnetic material that reduce permeability in an out-of-plane direction.

10. The magnetometer of claim 9, wherein a thickness of the one or more laminations allows shielding of in-plane magnetic fields.

11. An integrated circuit device, comprising:
a ring shield;
a magnetic yoke disposed within the ring shield; and
one or more magnetic field sensors disposed between the ring shield and the magnetic yoke, the magnetic field sensors positioned relative to the ring shield and the magnetic yoke such that flux induced by a magnetic field is absorbed in a cross-axis direction.

12. The device of claim 11, wherein the magnetic field sensors and magnetic yoke are positioned vertically at a midpoint of a height of the ring shield.

13. The device of claim 11, wherein the ring shield comprises soft magnetic material with permeability above a specified threshold.

14. The device of claim 13, wherein the device is mounted on, and electrically coupled to, an application specific integrated circuit for processing sensor data output by the magnetic field sensors.

15. The device of claim 11, wherein the ring shield further comprises two or more concentric rings of magnetic material.

16. The device of claim 11, wherein the magnetic field sensors are coupled in a Wheatstone bridge configuration with each sensor arranged to maximize sensitivity and minimize temperature influences.

17. The device of claim 11, wherein the ring shield further comprises a first ring shield portion of magnetic material, a second ring shield portion of magnetic material and a non-magnetic spacer disposed between ends of the first and second ring field portions of magnetic material.

18. The device of claim 17, wherein the non-magnetic spacer includes one or more laminations of non-magnetic material that reduce permeability in an out-of-plane direction.

19. The device of claim 18, wherein a thickness of the one or more laminations allows shielding of in-plane magnetic fields.

20. An electronic device, comprising:
a magnetometer comprising:
a ring shield;
a magnetic yoke disposed within the ring shield; and
one or more magnetic field sensors disposed between the ring shield and the magnetic yoke, the magnetic field sensors positioned relative to the ring shield and the magnetic yoke such that flux induced by a magnetic field is absorbed in a cross-axis direction of the magnetometer;
one or more processors;
memory storing instructions that when executed by the one or more processors, cause the one or more processors to perform operations comprising:
obtaining, by the one or more processors from the magnetometer, magnetometer output data; and
determining, by the one or more processors, a directional heading of the electronic device using the magnetometer output data.

* * * * *